United States Patent [19]

Min et al.

[11] Patent Number: 4,957,711

[45] Date of Patent: Sep. 18, 1990

[54] SINGLE CRYSTAL GROWING APPARATUS

[75] Inventors: Suk K. Min; Seung C. Park; Chul W. Han, all of Seoul, Rep. of Korea

[73] Assignee: Korea Advanced Institute of Science and Technology, Seoul, Rep. of Korea

[21] Appl. No.: 344,293

[22] Filed: Apr. 25, 1989

[30] Foreign Application Priority Data

Jul. 5, 1988 [KR] Rep. of Korea ............... 8305[U]

[51] Int. Cl.$^5$ ............... C30B 11/00; C30B 29/40; C30B 35/00
[52] U.S. Cl. ............... 422/245; 422/248; 156/616.1; 156/616.2; 156/616.4; 156/620.76; 156/DIG. 70
[58] Field of Search ............... 156/616.1, 616.2, 616.3, 156/616.4, 616.41, 620.76, 620.75, 620.2, DIG. 70, DIG. 73; 422/245, 248; 373/137, 139

[56] References Cited

U.S. PATENT DOCUMENTS

| | | | |
|---|---|---|---|
| 3,481,711 | 12/1969 | Maruyama | 156/620.76 |
| 3,767,473 | 10/1973 | Ayel et al. | 156/616.3 |
| 3,877,883 | 4/1975 | Berkman et al. | 156/616.2 |
| 4,737,233 | 4/1988 | Kamgar et al. | 156/DIG. 73 |

OTHER PUBLICATIONS

"Infrared Heating For People and Products", General Electric Lamp Division, 1974, pp. 1-23.
Pfann, "Zone Melting", pp. 62-63, J. Wiley and Son, Inc., New York, N.Y. 1958.

*Primary Examiner*—Gary P. Straub
*Attorney, Agent, or Firm*—Darby & Darby

[57] ABSTRACT

A horizontal Bridgman single crystal growing apparatus using a direct monitoring electric furnace suitable for a single crystal growing of III-V, II-VI group compound semiconductor materials (InP, CdTe, etc.) including a gallium arsenide (GaAs). The apparatus is composed of: a heater wire being formed around a quartz tube for supporting, a cylindrical double quartz tube arranged with cooling water or gas inlet and outlet for circulation externally and coated with gold thin film on the internal wall surface thereof, thereby the high temperature heating over 1240° C. is possible to obtain within a short period of time and also the cooling is possible, and whole process of the single crystal growing can be observed directly with naked eyes.

12 Claims, 3 Drawing Sheets

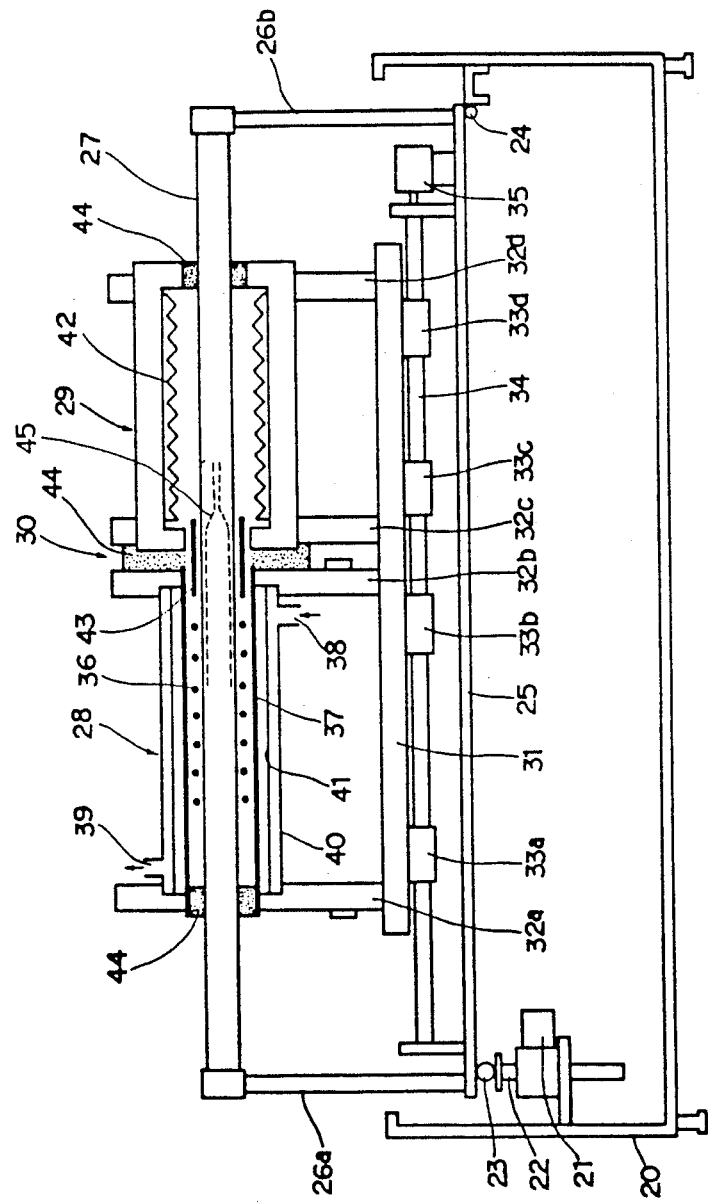

SINGLE CRYSTAL GROWING APPARATUS

BACKGROUND OF THE INVENTION

The present invention relates to a single crystal growing apparatus suitable for a single crystal growing of compound semiconductor materials of groups III-V and II-VI such as GaAs, InP, and CdTe, in particular to a horizontal Bridgman single crystal growing apparatus utilizing a direct monitoring electric furnace capable of rapid heating to high temperature over than 1240° C. and rapid cooling by an electric furnace having a cylindrical double quartz tube coated with gold film on the internal wall surface, and capable of maintaining an optimum single crystal growing condition by observing directly with naked eyes the whole process of single crystal growing.

A Bridgman single crystal growing apparatus had developed initially by Bridgman, P.W. of United States of America in 1925, and various researches have been carried out that utilizing the method as this from 1957. According to a basic principle of the horizontal Bridgman single crystal growing method, firstly a liquid state gallium (Ga) is disposed at a high temperature portion of the interior of a quartz reaction tube, at the same time a solid state arsenic (As) is disposed at a low temperature portion, thereafter the gallium arsenide is synthesized at a temperature over 1238° C. which is a melting temperature of the gallium arsenide, while the quartz reaction tube containing the melt of gallium arsenide is fixed, the growing furnace provided around the circumference of said quartz reaction tube is moved horizontally toward one direction along with the quartz reaction tube, thereby a single crystal can be grown by solidifying slowly from one end portion of the melt.

[Refer to : Bridgman, P.W., Proc. Amer. Acad. Sci. 60, 305 (1925),
Edmund, J.F. et al, Services Electronic
Research Laboratory Technical Journal 6,
123 (1957)]

In growing a single crystal with the Bridgman method as this, at first a contact between a seed crystal of gallium arsenide disposed into the interior of the quartz reaction tube and the melt of gallium arsenide is made, through this process a solidification becomes proceeded slowly in the direction of one way from said contacting portion as its starting point, at this moment, while maintaining the growing boundary interface formed between a solid state and a liquid state as a planar interface only by controlling precisely the growing temperature according to thereof, the manufacture of defect free gallium arsenide single crystal becomes possible.

Generally, in a horizontal Bridgman method or a liquid encapsulated Czochralski method, as a most dominant factor inducing a generation of dislocations in the case of single crystal growing, the instability of a crystal-melt interface during the solidifying process can be mentioned, this is because, in case where a seed crystal is surrounded with an incoherent state due to a surface tension of the melt upon contacting between a melt and a seed crystal so that a solidification arises first partly, fine twins or dislocations is produced from said portion.

Therefore, in case of a single crystal growing according to the seed crystal dipping of either a horizontal Bridgman method or a liquid encapsulated Czochralski method, it is possible to mention that whether or not how much the contact between a seed crystal and a melt being completely executed is a key for elimination of defect generation in the interior of the crystal.

And therefore, in case of a single crystal growing, while observing the process of series such as a contacting between a seed crystal and a melt being proceeded within inside of the quartz reaction tube and a formation of growing boundary interface, according to which a pertinent control becomes required, as a known observing method, following three methods may be cited:

(1) a method for forming a viewing window made of a quartz at
    a side portion of the growing furnace [FIG. 1(A)], (2) a method for measuring the temperatures by arranging a
    number of thermocouples [FIG. 1(B)], (3) a method for observing through an optical fiber [FIG. 1
    (C)], and each observing method is explained as follows.

At first, in a crystal growing furnace in a method for observing the single crystal growing of the interior of a quartz reaction tube through a quartz viewing window, as shown in FIG. 1 (A), a boat 4 having a melt of gallium arsenide 2 and a seed crystal 3 is disposed into the high temperature portion of the cylindrical quartz reaction tube 1 and an arsenic 5 of solid state is encapsulated into the low temperature portion thereof, to a growing furnace 7 having a heater wire 6 wound on the outer circumference of the quartz reaction tube 1 there is formed with a quartz viewing window 8 for observing the growing process of a crystal at a side surface of a temperature portion being formed with a growing boundary interface. The reference numeral 9 is a thermocouple, and 10 is a quartz tube for a diffusion barrier.

However, in case of a method for observing the crystal growing process by making a quartz viewing window 8 as thus, since a symmetry of the cylindrical furnace 7 at the portion said quartz viewing window 8 being made is broken down and a nonuniformity of the temperature distribution arises at this portion, so that it causes the result that the crystal growing boundary interface is inclined or distorted and also exerts a bad effect to the temperature distribution of a melt state and a growing speed, therefore there has been a difficulty to obtain a complete single crystal without any crystal defect. Accordingly, though a few supplementary devices such as those utilizing either a reflection plate or a separate auxiliary furnace for solving the problems have been developed, these devices are not only complicated, but also it could not be expected the complete solution of said problems. Further, since a region possible to observe through the quartz viewing window 8 made at a wall of the crystal growing furnace 7 becomes observing only the extremely limited region proportional to the magnitude of the opening of said quartz viewing window 8 there has been a problem that the correct observation for said contacting location during the contacting process between a seed crystal and the melt of gallium arsenide is difficult.

[Refer to : Deyris, E : La Radiotechnique - compelec, France : French. Pat. No. 1494831.
L.R. Weisberg et al, J. Electrochem. Soc.
109 (1962) 642]

Next, according to a method utilizing the thermocouples, as shown in FIG. 1(B), in a crystal growing furnace 7 in which a quartz tube for a diffusion barrier 10 is disposed at an intermediate position, a boat 4 containing a seed crystal 3 and the melt of gallium arsenide 2 and an arsenic 5 of solid state are respectively disposed at each side thereof within the quartz reaction tube 1, and a heating pipe 6 of the electric furnace mounted around the circumference of said quartz reaction tube 1, which is the method for observing the temperature of the interior of a growing furnace 7 by arranging a number of thermocouples 9a, 9b for measurement within the interior of said quartz reaction tube 1, this method is advantageous in a view point that the uniform temperature distribution can be obtained within the growing furnace relative to the method observing through a quartz viewing window as aforementioned because it does not break the symmetry of the temperature distribution of the growing furnace 7, however the precise temperature control is possible only at a limited region adjacent that the contact of a seed crystal and the melt of gallium arsenide being carried out and the direct observation of the materials is impossible, therefore there has been a problem that it is difficult to apply the method for tilting the growing furnace in case of contacting the seed crystal and melt.

[Refer to : J.M. Parsey et al, J. Electrochem. Soc. 129, No. 2 (1982) 388]

As the other observing method, as shown in FIG. 1(C), though there has been known an observing method by utilizing an optical fiber bundle 11 of a system displaying on a monitor by taking photograph the whole growing process of a crystal 14 by utilizing vidicon camera through the lenses 12a, 12b and optical fiber bundle 11, this method has a problem because not only the cost of device becomes high, but also the state of the solid-liquid boundary interface is not observed distinctly, therefore this observing method is not utilized in general.

[Refer to : N.S. Kapany, Fiber Optics, Academic Press, New York (1967)]

SUMMARY OF THE INVENTION

Therefore, an object of the present invention is to provide a single crystal growing apparatus which can solve various problems encountered in the conventional single crystal growing method.

According to the present invention, a direct monitoring electric furnace is provided which is constructed in such a manner that : a gold thin film is formed by coating a gold solution (Granzgold GG 2110, DODUCO KG. W-Germany) on an internal wall surface of the double quartz tube capable of circulating a cooling water through the interior thereof; to which interior of said double quartz tube there is provided a protecting quartz tube of cylindrical shape for preventing the direct heating of the gold thin film by absorbing primarily an infra-red ray from a heater wire; between the protecting quartz tube and a quartz reaction tube is disposed a heater wire which is a kanthal A-1 wire divided into two regions, whose heater wire is supported with a number of alumina spacers for preventing the contact between the heater wires adjacent to each other; alumina adhesive is covered to the alumina spacers and alumina support rods for maintaining a proper form of the heater itself upon heating to high temperature.

In which, the gold thin film coated on the internal wall surface of the double quartz tube serves a function of a heat insulator by reflecting the most of infra-red rays, at the same time, is advantageous to the expansion of uniform temperature area toward a radiation direction and a growing axis direction of the electric furnace owing to a strong heat converging force; a high temperature heating to a uniform temperature over than 1240° C. within a short period of time and rapid cooling are rendered to be possible due to minimizing of a heat capacity and also in particular a growing boundary interface in the solid and liquid state can be directly observed in case of the crystal growing according as the infra-red ray is reflected and a visible ray is transmitted partly.

BRIEF DESCRIPTION OF THE DRAWINGS

FIGS. 1(A) to 1(C) are exemplary schematic diagrams illustrating each method for observing the conventional crystal growing process, in which FIG. 1(A) shows a method for observing through a quartz viewing window, FIG. 1(B) shows a method for observing by utilizing a number of thermocouples, FIG. 1(C) shows a method for observing by utilizing an optical fiber.

FIG. 2 is a front elevational view partly cut out of a crystal growing apparatus of a preferred embodiment according to the present invention.

DETAILED DESCRIPTION OF THE INVENTION

Figure 1A:
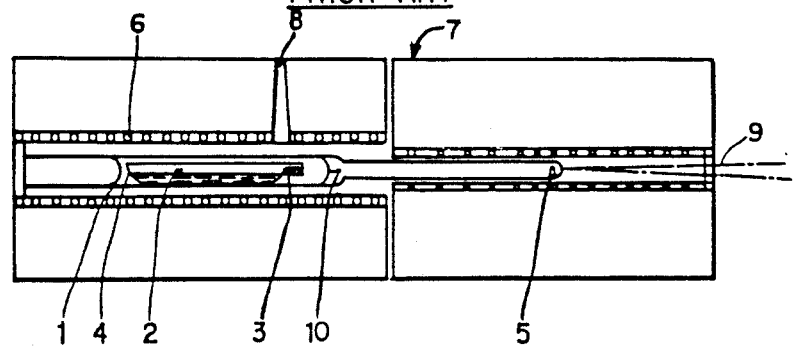
Figure 1B:
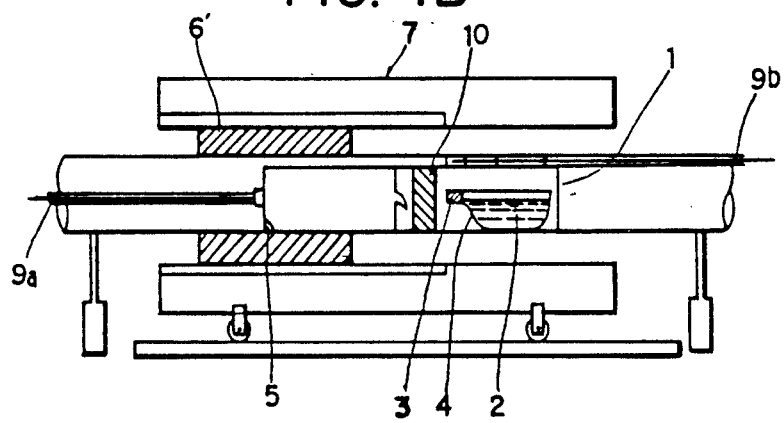
Figure 1C:
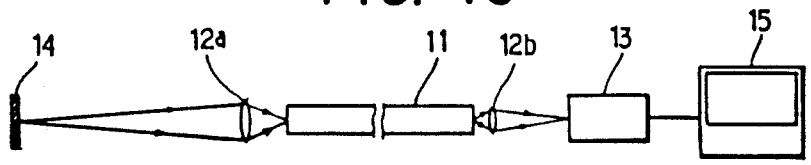

The present invention will be described in detail with reference to the accompanying drawings hereinafter.

FIG. 2 is a front elevational view partly cut out showing a single crystal growing apparatus utilizing a direct monitoring electric furnace according to a preferred embodiment of the present invention, in which a quartz tube 27 for fixing a quartz reaction tube is provided horizontally by two supporting legs 26a and 26b fixed vertically at both ends of a base plate 25, whose one end is supported by a connecting rod 23 through a lifting shaft 22 of a motor 21 fixedly mounted at one end portion of a frame 20, and the other end is supported by a hinge 24 fixed at the other end portion of the frame 20; a growing furnace 30 having two regions of a high temperature part electric furnace 28 and a low temperature part electric furnace 29 mounted around said quartz tube 27 for supporting is supported by the supporting legs 32a, 32b, 32c, 32d made of fire-proof bricks fixed vertically on a supporting plate 31; said supporting plate 31 is movably mounted in a direction of right and left along with two sets of guide rails 34 fixed parallel to the base plate 25 through linear ball bearings 33a, 33b, 33c, 33d; and a horizontal movement of this supporting plate 31 is carried out by driving a step motor 35 fixed at one side end of the guide rails 34.

In a high temperature part electric furnace 28 of said growing furnace 30, a heater wire 36 supported with alumina spacers is formed around the cylindrical circumference of the quartz tube 27, which is composed of a cylindrical double quartz tube 40 capable of circulating a cooling water or gas around the circumference of said protecting quartz tube 37 and having a cooling water or gas inlet 38 at one lower side end, as well as a cooling water or gas outlet 39 at one upper side end, and a gold thin film is coated on an internal wall surface 41 of said double quartz tube 40.

A low temperature part electric furnace 29 is supported on a cylindrical fire-proof heat plate arranged with five nichrome wires 42 for obtaining a predetermined temperature gradient by combining applicably the independently separated five temperature regions, and on the connecting portion of the high temperature part electric furnace 28 and the low temperature part electric furnace 29 a quartz tube 43 for connection is arranged, and to which external space is filled with a quartz fiber 44 for preventing a heat loss.

In the present invention constructed as above, a horizontal movement of the crystal growing furnace 30 is achieved by driving a step motor 35 along with the guide rails 34, and a tilting for contacting of a seed crystal and the melt of gallium arsenide is accomplished by turning the growing furnace 30 as a whole around hinge 24 according to the up and down movement of the lifting shaft 22 by driving a motor 21 fixed with a linear head.

Figure 3:
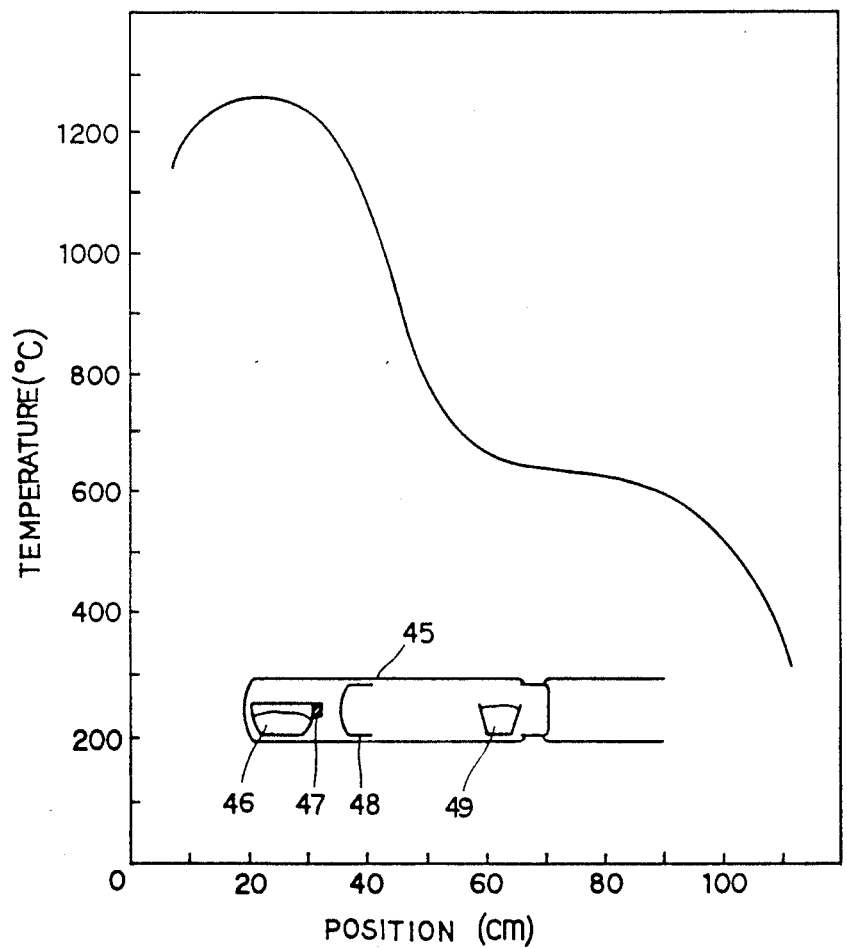
FIG. 3 is a graph illustrating a temperature distribution of a crystal growing apparatus of a preferred embodiment.

In addition, according to the present invention, a large amount of temperature gradient can be obtained in a direction toward the crystal growing as shown in FIG. 3 by maintaining a predetermined space distance between a high temperature part furnace 28 and a low temperature part furnace 29, in which a numeral 46 is a gallium encapsulated into the quartz reaction tube 45, 47 is a seed crystal, 48 is a diffusion barrier tube and 49 is an arsenic.

As described above in detail, the present invention renders a gallium arsenide single crystal to grow while directly observing the contacting process of a seed crystal and the melt, a shape of the solid-liquid boundary interface and the proceeding condition by a direct monitoring electric furnace structured with double quartz tube coated with a gold thin film on the internal wall surface, thereby a uniform temperature distribution can be obtained at the temperature over than 1240° C. because the converging force of a high temperature part is strong, and the high temperature heating over than 1240° C. is possible within a short period of time because of minimizing the heat capacity and also having the advantages of cooling and the temperature control being easy, therefore it can be applied also to a single crystal growing and a poly crystal synthesis of III-V, II-VI group compound semiconductor materials containing gallium arsenide.

What is claimed is:

1. A single crystal growing apparatus, which comprises a growing furnace including a high temperature part electric furnace and a low temperature part electric furnace, said growing furnace being at an outer peripheral surface of a quartz tube which supports a quartz reaction tube, the growing furnace being elongated and movable in the direction of elongation, said quartz tube being supported so as to be tiltable in a plane perpendicular to the direction of elongation, said high temperature part electric furnace having a heater wire disposed outside of the quartz tube, a cylindrical protecting quartz tube disposed outside of the heater wire, and a cylindrical double quartz tube and disposed at the outside of the protecting quartz tube which is provided with an inlet and an outlet through an outer wall of said cylindrical double quartz tube, and a gold film deposited at an inner wall of said cylindrical double quartz tube, said protecting quartz tube blocking direct heating of the gold film from the heater wire, said cylindrical double quartz tube having an interior between said inlet and said outlet through which cooling water or gas may circulate.

2. A single growing apparatus according to claim 1, wherein said high temperature part electric furnace and low temperature part electric furnace are integrally formed at a periphery of the first-mentioned quartz tube at an intermediary area of the first-mentioned quartz tube.

3. A single crystal growing apparatus according to claim 1, wherein said heater wire has at least two temperature regions and is supported by alumina support rods and alumina spacers.

4. A single crystal growing apparatus comprising:
an elongated quartz tube;
heating means extending about an outer periphery of said tube and in a direction of elongation of said tube;
a double quartz tube extending about an outer periphery of said heating means and in the direction of elongation of said elongated quartz tube, said double quartz tube having an interior through which a coolant may circulate;
means for generating infrared rays;
a film on an internal surface of said double quartz tube, said film reflecting most infrared rays that reach said film; and
means for preventing direct heating of said film which otherwise takes place because of absorption of said infrared rays by said film.

5. An apparatus as in claim 4, further comprising means for tilting the furnace as a whole so as to enable growth of a boundary interface in a solid and liquid state during heating within said elongated quartz tube, said double quartz tube being formed to enable observation of said boundary interface through said double quartz tube, said film allowing passage of visible light rays although infrared rays are reflected.

6. An apparatus as in claim 4, wherein said film is a gold film.

7. An apparatus as in claim 4, wherein said double quartz tube has an inlet and an outlet which are in communication with said interior of said double quartz tube and which open outside of said double quartz tube.

8. An apparatus as in claim 4, further comprising means for moving the furnace in the direction of elongation of the elongated quartz tube.

9. An apparatus as in claim 4, wherein said generating means includes heating wires adjacent to each other, further comprising:
means for spacing apart said heating wires from each other.

10. An apparatus as in claim 4, wherein said heating means includes two heating elements each arranged about a respective portion of said elongated quartz tube, one of said two heating elements providing more heat than the other of said two heating elements.

11. An apparatus as in claim 4, wherein said preventing means includes a protective quartz tube in said interior of said double quartz tube.

12. An apparatus as in claim 10, wherein said two heating elements are separated from each other so as to obtain an amount of temperature gradient in a direction toward where a crystal is to be grown within said elongated quartz tube.

* * * * *